United States Patent [19]
Choi et al.

[11] Patent Number: 6,031,395
[45] Date of Patent: Feb. 29, 2000

[54] CMOS SEMICONDUCTOR CIRCUIT FOR GENERATING HIGH OUTPUT VOLTAGE

[75] Inventors: Jeong-Ae Choi, Woolsan-Si; Kyu-Tae Kim, Pucheon-Si, both of Rep. of Korea

[73] Assignee: LG Semicon Co., Ltd., Chungcheongbuk-do, Rep. of Korea

[21] Appl. No.: 09/081,300

[22] Filed: May 20, 1998

[30] Foreign Application Priority Data

Jul. 10, 1997 [KR] Rep. of Korea .......................... 97-32017

[51] Int. Cl.$^7$ .......................... H03K 19/094; H03K 19/20
[52] U.S. Cl. .............................. 326/83; 326/83; 326/86; 326/112
[58] Field of Search .................... 326/83, 80, 81, 326/86, 68, 21, 112, 119, 121

[56] References Cited

U.S. PATENT DOCUMENTS

| | | |
|---|---|---|
| 5,465,054 | 11/1995 | Erhart . |
| 5,604,449 | 2/1997 | Erhart et al. ............................... 326/81 |
| 5,729,155 | 3/1998 | Kobatake ................................... 326/68 |
| 5,748,025 | 5/1998 | Ng et al. ................................... 327/333 |
| 5,808,480 | 9/1998 | Morris ....................................... 326/81 |
| 5,955,891 | 9/1999 | Makino et al. ............................ 326/33 |

*Primary Examiner*—Michael Tokar
*Assistant Examiner*—James A. Cho

[57] ABSTRACT

A semiconductor circuit for generating a high output voltage which includes: a first dividing circuit connected to a first fixed voltage and a second dividing circuit connected to second fixed voltage lower than the first fixed voltage, each dividing circuit having a plurality of stages for dividing an input voltage, a total number of the stages being sufficient to ensure that individual voltage drops across the stages, respectively, do not exceed a channel breakdown voltage for a predetermined transistor technology; a pull-up circuit, connected to the first dividing circuit, for pulling up an output voltage to a first predetermined level, the pull-up circuit having a plurality of modules sufficient in number to ensure that individual voltage changes across the modules, respectively, do not exceed the breakdown voltage; a pull-down circuit, connected to the second dividing circuit, for pulling down the output voltage to a second predetermined level, the pull-down circuit having a plurality of modules sufficient in number to ensure that individual voltage drops across the modules, respectively, do not exceed the breakdown voltage; a first control circuit for enabling or disabling operation of the pull-up circuit based upon at least one voltage from the first voltage dividing circuit; and a second control circuit for disabling or enabling the pull-down circuit, respective to the first control circuit, based upon at least one voltage from the second voltage dividing circuit.

24 Claims, 5 Drawing Sheets

CM OS SEMICONDUCTOR CIRCUIT FOR GENERATING HIGH OUTPUT VOLTAGE

BACKGROUND OF THE INVENTION

1. Field of the Invention

The present invention relates to a semiconductor circuit which generates a high output voltage in a CMOS device having lower channel breakdown voltage.

2. Discussion of Related Art

As a semiconductor device is highly integrated, the channel length of a CMOS transistor forming the semiconductor device becomes small, and thus the channel breakdown voltage is also reduced. Accordingly, higher output voltage cannot be created from the device. To solve this problem, several methods for generating high output voltages in integrated circuits have been proposed. One method is to employ a process for high voltage, and another is to use a shield voltage. The first method requires a special additional process. Thus, the circuit area and its complexity are greater than the method using a shield voltage. Accordingly, the method using the shield voltage is the typical approach to generate a high as voltage in the integrated circuit because it limits the range of voltage applied to each transistor.

This method is described below with reference to FIG. 1. FIG. 1 is a circuit diagram of a conventional semiconductor circuit for generating a high output voltage. Referring to FIG. 1, the semiconductor circuit includes: a first PMOS transistor P1, which receives a shield voltage VSHLD for controlling the operation of the circuit at its gate, and receives an input signal at its source; a second PNOS transistor P2, which receives the signal from the drain of first PMOS transistor P1 at its gate, and receives a predetermined positive voltage VDD at its source; a third PMOS transistor P3, which receives the signal output from the drain of second PMOS transistor P2 at its source, and receives the shield voltage VSHLD at its gate; a first NMOS transistor N1, which receives the shield voltage VSHLD with its gate, and receives the input signal with its drain; a second NMOS transistor N2, which receives at its gate the signal output from the source of first NMOS transistor N1, and its source is grounded; and a third NMOS transistor N3, which is constructed in a manner that its source is connected to the drain of second NMOS transistor N2, its drain receives the voltage applied to the drain of third PMOS transistor P3, and its gate receives shield voltage VSHLD. The substrate bias voltage of first, second and third transistors P1, P2 and P3 are set to positive voltage VDD, and that of first, second and third NMOS transistors are set to the ground voltage.

The above-described semiconductor circuit for preventing the channel breakdown is disclosed in U.S. Pat. No. 5,465,054, and its operation is described below.

When VDD is 10 V, then VSHLD is half of VDD, 5 V. First PMOS transistor P1, third PMOS transistor, first NMOS transistor N1 and third NMOS transistor N3 are controlled by the input voltage VIN. When the input voltage VIN is 10 V (on the source of P1) and the VSHLD voltage is 5 V (on the gate of P1), P1 turns on, so the gate voltage of P2 becomes 10 V. When the gate voltage of P2 is 10 V, i.e., approximately the same as VDD on the source of P2, the second PMOS P2 turns off.

Assuming that the drain of N1 previously was in a LOW voltage state and the gate of N1 is 5 V, N1 turns on and begins to conduct. When the voltage on the source of N1, i.e., the gate voltage of N2, is about 5 V, the second NMOS transistor N2 turns on. Because N2 is turned on, the source of N3 is 0 V and the gate of N3 is 5 V, so N3 turns on causing the drain of N3 to drop to 0 V. The drain of P3 is connected to the drain of N3 and goes to 0 V, so P3 turns off. The PMOS transistors P2 and P3 each have a very big resistivity Roff and VDD voltage is divided in half across P2 and P3. So the source of P3, that is the drain of P2, becomes 5 V, i.e., VDD÷2.

As described above, regardless of whether the output voltage is changed from 0 V to 10 V, the channel breakdown voltage across the source and drain of second and third PMOS transistors P2 and P3 (which perform a pull-up function), and second and third NMOS transistors N2 and N3 (which perform a pull-down function), remains limited to approximately 5 V. Accordingly, it is possible to create an output voltage that is twice as great as the channel breakdown voltage.

The conventional semiconductor circuit shown in FIG. 1 serves as an inverter. Thus, the semiconductor circuit operates normally if the source potential of first NMOS transistor N1 is in a floating state, when the input signal is "HIGH". Thus, the stability of the entire operation is deteriorated. Furthermore, when driving voltage VDD increases from 10 V to 15 V, in order to create a higher output voltage, the voltage across the source and drain of second and third PMOS transistors P2 and P3, and second and third NMOS transistors N2 and N3 becomes approximately 7.5 V. When driving voltage VDD is increased to 30 V, the voltage across the source and drain of the transistors becomes approximately 15 V.

If the driving positive voltage increases excessively, an excessive voltage is applied across the source and drain of each of transistors P2, P3, N2 and N3, and thus channel breakdown occurs in these transistors, producing poor operation of the circuit. As a result, an output voltage that is twice as great as the channel breakdown voltage cannot be created when the driving voltage is increased above a predetermined limiting value.

SUMMARY OF THE INVENTION

Accordingly, the present invention is directed to a semiconductor circuit for generating a high voltage that substantially obviates one or more of the problems due to limitations and disadvantages of the related art.

An object of the present invention is to provide a semiconductor circuit for generating a high voltage, in which voltage pull up and pull down phenomenas are divided into multiple steps or stages to obtain a larger variation in the range of voltage provided at its output terminal even though the transistors of the circuit have relatively low channel breakdown voltage, e.g., because they are CMOS technology. The conventional problem, namely where the output is created for a specific input signal only in floating state, is solved by the invention.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor circuit for generating a high output voltage includes: a voltage-divided signal generator for controlling turn-on, which is sequentially turned on only when an input signal is in a first logic state, to step down the driving voltage having a predetermined level in ratios different from each other, thereby generating first and second voltage-divided signals, and sequentially turned on only when the input signal is in a second logic state, to step down the input signal in ratios different from each other, thereby generating third and fourth voltage-divided signals; a voltage variation limiting circuit for receiving a first control signal, second control signal, and the second and third voltage-divided signals output from the voltage-divided signal generator, to pulls up or pulls down data nodes according the state of each signal, the first control signal being a signal which is voltage-reduced from the driving voltage to a predetermined level, the second control signal being a signal which is voltage-reduced from the driving voltage to a level lower than that of the first control signal, the voltage variation limiting circuit maintaining a fixed variation width between the ground potential and driving voltage; and an output signal generator for pulling up and pulling down the potential applied to an output terminal according to the voltage state of the data nodes, which are maintained within a fixed range by the voltage variation limiting circuit, the pull-up part forming a driving voltage transmitting path according to the first control signal and first voltage-divided signal, the pull-down part forming a ground potential transmitting path according to the second control signal and fourth voltage-divided signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
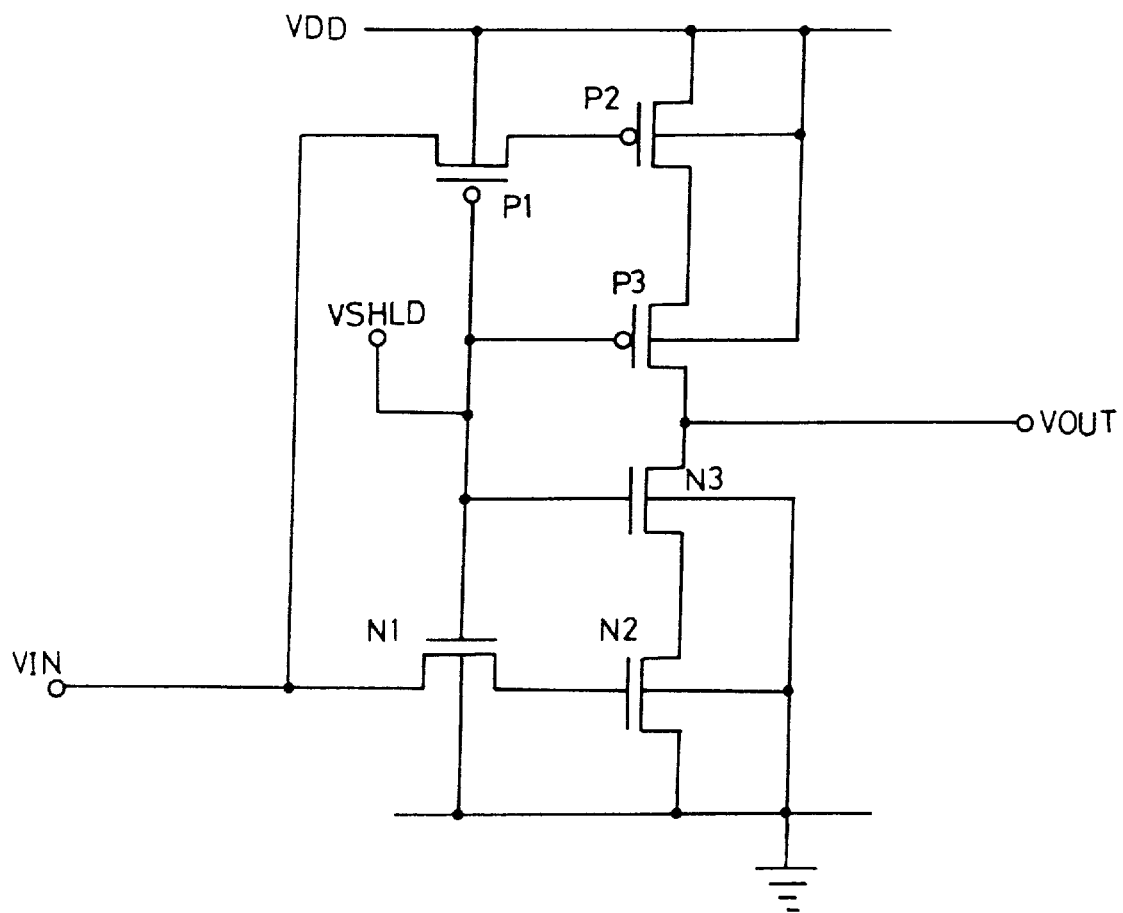
FIG. 1 is a circuit diagram of a conventional CMOS inverter circuit.
Figure 2:
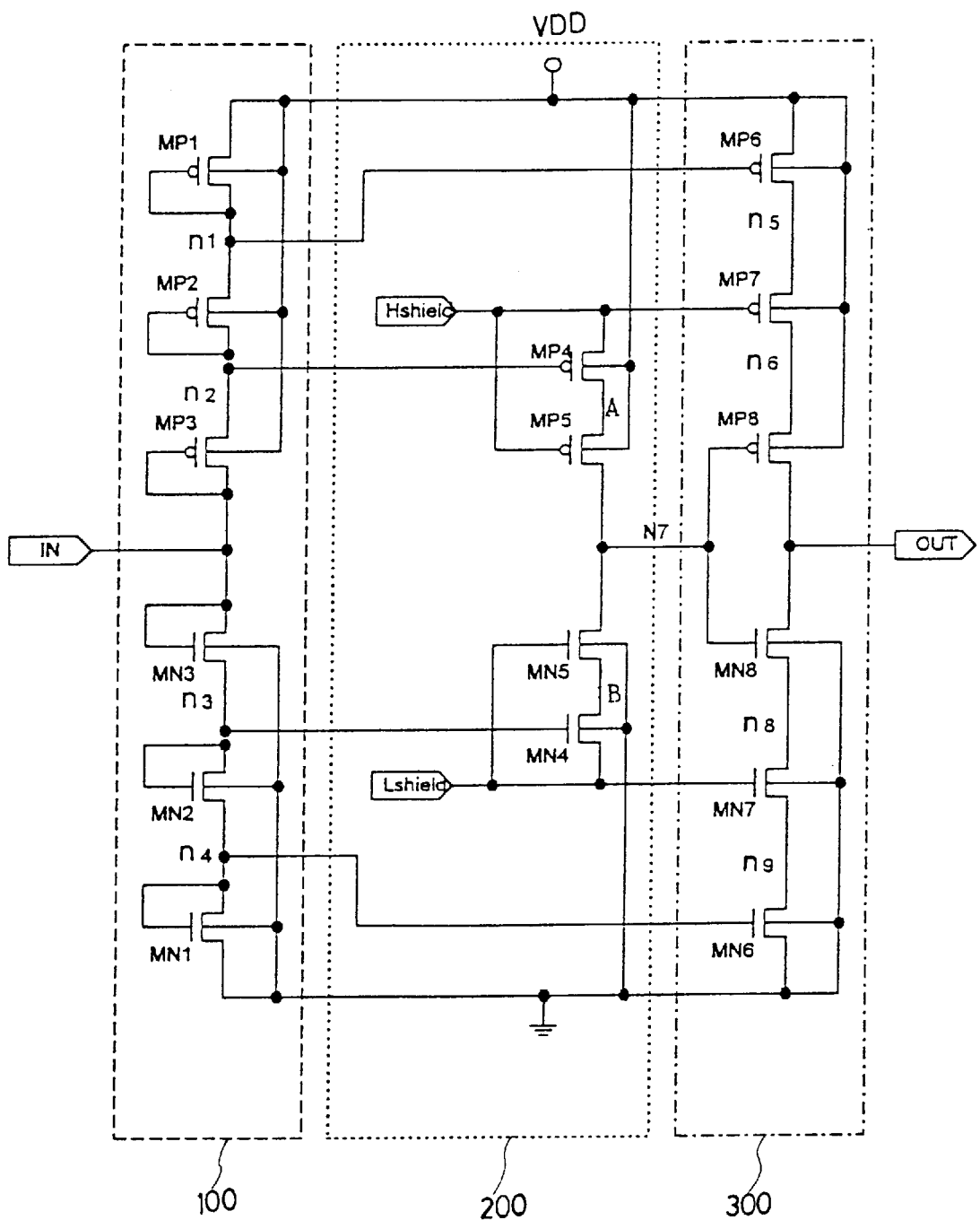
FIG. 2 is a block diagram of a CMOS inverter circuit for generating a high output voltage according to the present invention.

FIG. 2 is a block diagram of a semiconductor circuit according to the present invention, which is configured as an input circuit 100, shield circuit 200 and output circuit 300. Input circuit 100 includes a first PMOS transistor MP1 which is constructed in a manner that its source receives a predetermined positive voltage VDD as its driving voltage, positive voltage VDD is also applied as its bias voltage, and its gate and drain are connected to each other; a second PMOS transistor MP2 which is constructed in such a manner that its source receives the voltage applied to the drain of first PMOS transistor MP1, positive voltage VDD is applied as its bias voltage, and its gate and drain are connected to each other; a third PMOS transistor MP3 which is constructed in a manner that its source receives the voltage applied to the drain of second PMOS transistor MP2, positive voltage VDD is applied as its bias voltage, and its gate and drain are connected to each other; a third NMOS transistor MN3 which is constructed in a manner that its drain and gate are connected in common to a signal input terminal connected to the drain of third PMOS transistor MP3, and ground potential is applied as its bias voltage; a second NMOS transistor MN2 which is constructed in such a manner that its drain and gate receive the voltage applied to the source of third NMOS transistor MN3, and the ground voltage is applied as its bias voltage; and a first NMOS transistor MN1 constructed in such a manner that its drain and gate receive the voltage applied to the source of second NMOS transistor MN2, and the ground voltage is applied to its source and as its bias voltage.

Shield circuit 200 includes a forth PMOS transistor MP4 which is constructed such that its source receives a first control or bias voltage Hshield, having a predetermined voltage, positive voltage VDD is applied as its bias voltage, and its gate receives the voltage applied to the drain of second PMOS transistor MP2; a fifth PMOS transistor MP5, which is turned on or off according to first control voltage Hshield applied to its gate, which is constructed so that its source receives the voltage applied to the drain of fourth PMOS transistor MP4, and to which positive voltage VDD is applied as its bias voltage; a fifth NMOS transistor MN5 which is turned on or off according to the state of a second control or bias voltage Lshield applied to its gate, and is constructed so that its drain is connected to the drain of fifth PMOS transistor MP5 and the ground potential is applied as its bias voltage; and a fourth NMOS transistor MN4 which is constructed in a manner that its drain is connected to the source of fifth NMOS transistor MN5, and its gate receives the voltage applied to the drain of second NMOS transistor MN2.

Output circuit 300 include a sixth PMOS transistor MP6, which is constructed such that its source receives positive voltage VDD as its driving voltage, positive voltage VDD is applied as its bias voltage, and its gate receives the voltage applied to the source of second PMOS transistor MP2; a seventh PMOS transistor MP7, which is turned on or off according to first control voltage Hshield applied to its gate, and is constructed in a manner that its source receives the voltage applied to the drain of sixth PMOS transistor MP6, and positive voltage VDD is applied as its bias voltage; an eighth PMOS transistor MP8 which is constructed in such a manner that its source receives the voltage applied to the drain of seventh PMOS transistor MP7, positive voltage VDD is applied as its bias voltage, and its gate receives the voltage output from the drain of fifth PMOS transistor MP5; an eighth NMOS transistor MN8 which is constructed such that its drain is connected to a signal output terminal connected to the drain of eighth PMOS transistor MP8, its gate is connected in common with the gate of the seventh PMOS transistor MP7, and the ground potential is applied as its bias voltage; a seventh NMOS transistor MN7 which is constructed in a manner that its drain receives the voltage applied to the source of eighth NMOS transistor MN8, the ground potential is applied as its bias voltage, and its gate receives second control voltage Lshield; and a sixth NMOS transistor MN6 which is constructed so that its drain receives the voltage applied to the source of seventh NMOS transistor MN7, the ground potential is applied on its source and as its bias voltage, and its gate receives the voltage applied to the drain of first NMOS transistor MN1.

The operation of the aforementioned semiconductor circuit for generating a high output voltage is described below with reference to FIG. 3.

First and second control voltages, Hshield and Lshield, have the levels corresponding to two thirds and one third of positive voltage VDD supplied as the driving voltage, respectively. For example, when positive voltage VDD is 15 V, first control voltage Hshield is 10 V, and second control voltage Lshield is 5 V. The voltage of the input terminal is equally distributed to the transistors of input circuit 100 when first, second and third PMOS transistors MP1, MP2 and MP3 are equivalent, and first, second and third NMOS transistors MN1, MN2 and MN3 are equivalent. Thus, the voltages applied on the connection nodes of the transistors forming the input circuit, that is, first to fourth nodes n1 to n4, have the levels shown in the following table 1. Here, the input voltage is 0 to 15 V, and the voltage applied to one transistor is 5 V.

TABLE 1

|  | First node (n1) | Second node (n2) | Third node (n3) | Fourth node (n4) |
|---|---|---|---|---|
| Input; HIGH (15 V) | 15 V | 15 V | 10 V | 5 V |
| Input; LOW (0 V) | 10 V | 5 V | 0 V | 0 V |

As shown in Table 1, in order to prevent excessive voltage from being applied to the transistors forming output circuit 300 corresponding to the voltage distribution in input circuit 100 in accordance with the input voltage, the voltages applied to the gates of the transistors have the levels shown in table 2. The input voltage is 0 to 15 V, and the voltage applied to one transistor is 5 V.

TABLE 2

|  | MP6 | MP7 | MP8 | MN8 | MN7 | MN6 |
|---|---|---|---|---|---|---|
| Input; HIGH (15 V) | 15 V | 10 V | 5 V | 5 V | 5 V | 5 V |
| Input; LOW (0 V) | 10 V | 10 V | 10 V | 10 V | 5 V | 0 V |

As shown in Table 2, a fixed voltage is applied to the gate of seventh PMOS transistor MP7 and seventh AMOS transistor MN7 all the time. Thus, first and second control voltages, Hshield and Lshield, are used for the gates as the control signals. The voltages applied on nodes n1 and n4 of input circuit 100, that is, the voltage applied to the source of second PMOS transistor MP2 and voltage applied to the drain of first NMOS transistor MN1, are used for the gate of sixth PMOS transistor MP6 and sixth NMOS transistor MN6 as the control signals.

When the voltage level of an input signal IN is approximately equal similar to positive voltage VDD, i.e., "HIGH", the voltage applied on nodes n1 and n2 have the levels ranging from input signal IN to positive voltage VDD. Accordingly, first, second and third PMOS transistors MP1, MP2 and MP3 are all turned off. Furthermore, the voltage applied on nodes n3 and n4 ranges from the ground potential to voltage of the input signal because input signal IN is "HIGH". Thus, first, second and third NMOS transistors MN1, MN2 and MN3 are all turned on.

Accordingly when input signal IN is "HIGH," current flows through the channels of first, second, and third NMOS transistors MN1, MN2 and MN3 and voltage is equally dropped across the transistors, so that a voltage of 10 V is applied to third node n3, a voltage of 5 V is applied to fourth node n4, and a voltage of 15 V is applied to first and second nodes, n1 and n2, as shown in Table 1. By doing so, the voltage of second node n2 is applied to the gate of fourth PMOS transistor MP4, of shield circuit 200, turning off the fourth PMOS transistor.

Moreover, the voltage of fourth node n4 is applied to the gate of fourth NMOS transistor MP4, so that the fourth NMOS transistor performs the turn-on operation at the saturation state.

Under these conditions (that the input signal IN is "HIGH"), fifth PMOS transistor MP5 maintains a turn-on state because first control voltage, Hshield, applied to its gate is if lower than the bias voltage, and fifth NMOS transistor MN5 maintains a turn-on state because second control voltage Lshield is higher than the bias voltage. In this state, second control voltage Lshield is applied to the seventh node n7 due to the turn-on state of fourth and fifth NMOS transistors. However, a voltage lower than the second control voltage is actually applied since a voltage drop occurs while the transistors are turned on.

Furthermore, sixth NMOS transistor MN6 and seventh NMOS transistor MN7 are turned on because the voltage of fourth node n4 and second control voltage Lshield, which are respectively applied to the gate of sixth and seventh NMOS transistors MN6 and MN7, are higher than the ground voltage. Eighth NMOS transistor MN8, whose gate receives the voltage of seventh node n7, is also turned on. Accordingly, as shown in Table 2, the voltages applied to the gates of sixth, seventh and eighth PMOS transistors, MP6, MP7 and MP8, are approximately 15 V, 10 V and 5 V, respectively, and the voltages applied to the gates of sixth, seventh and eighth NMOS transistors MN6, MN7 and MN8 are 5 V, 5 V and 5 V, respectively. Thus, the transistors other than the sixth PMOS transistor are all turned on.

However, with the PMOS transistors for pulling up the voltage of the output circuit, the driving voltage is not applied to the output circuit because sixth PMOS transistor MP6 is turned off. Alternately, with the NMOS transistors for pulling down the voltage of the output circuit, the NMOS transistors are all turned on, so that the ground voltage is applied to the output circuit.

When input signal IN is "LOW", the semiconductor circuit operates in a manner opposite to the aforementioned one. That is, a voltage higher than first control voltage Hshield is applied to seventh node n7. FIG. 3 shows the relation of the voltage on seventh node n7, voltage A which is applied to the source of fifth PMOS transistor MP5 and voltage B which is applied to the drain of fifth NMOS transistor MN5. FIG. 4 shows the relation of the voltage applied on seventh node n7 and input/output voltages.

Figure 3:
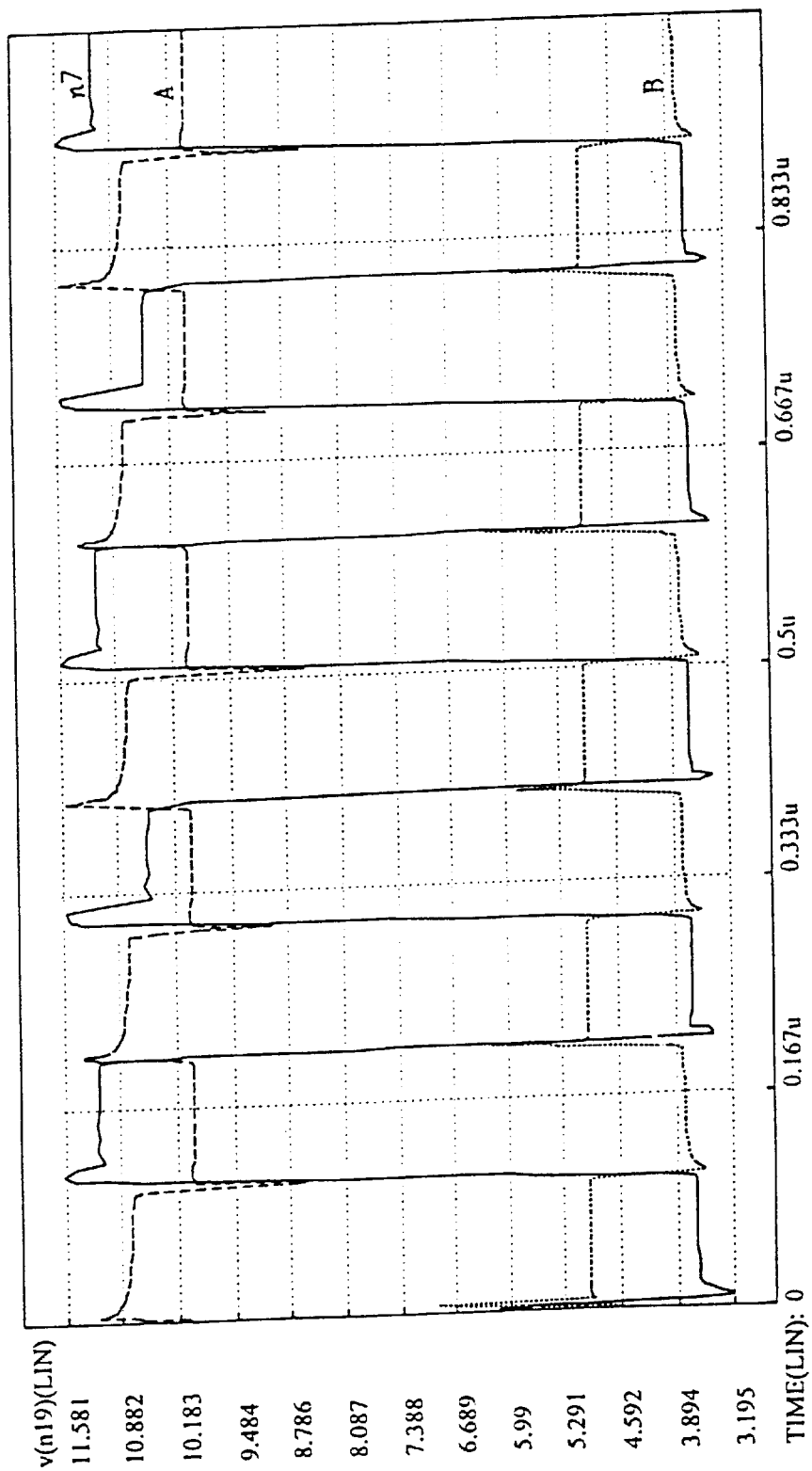
FIG. 3 shows waveforms of the principal part of the shielding part of FIG. 2.
Figure 4:
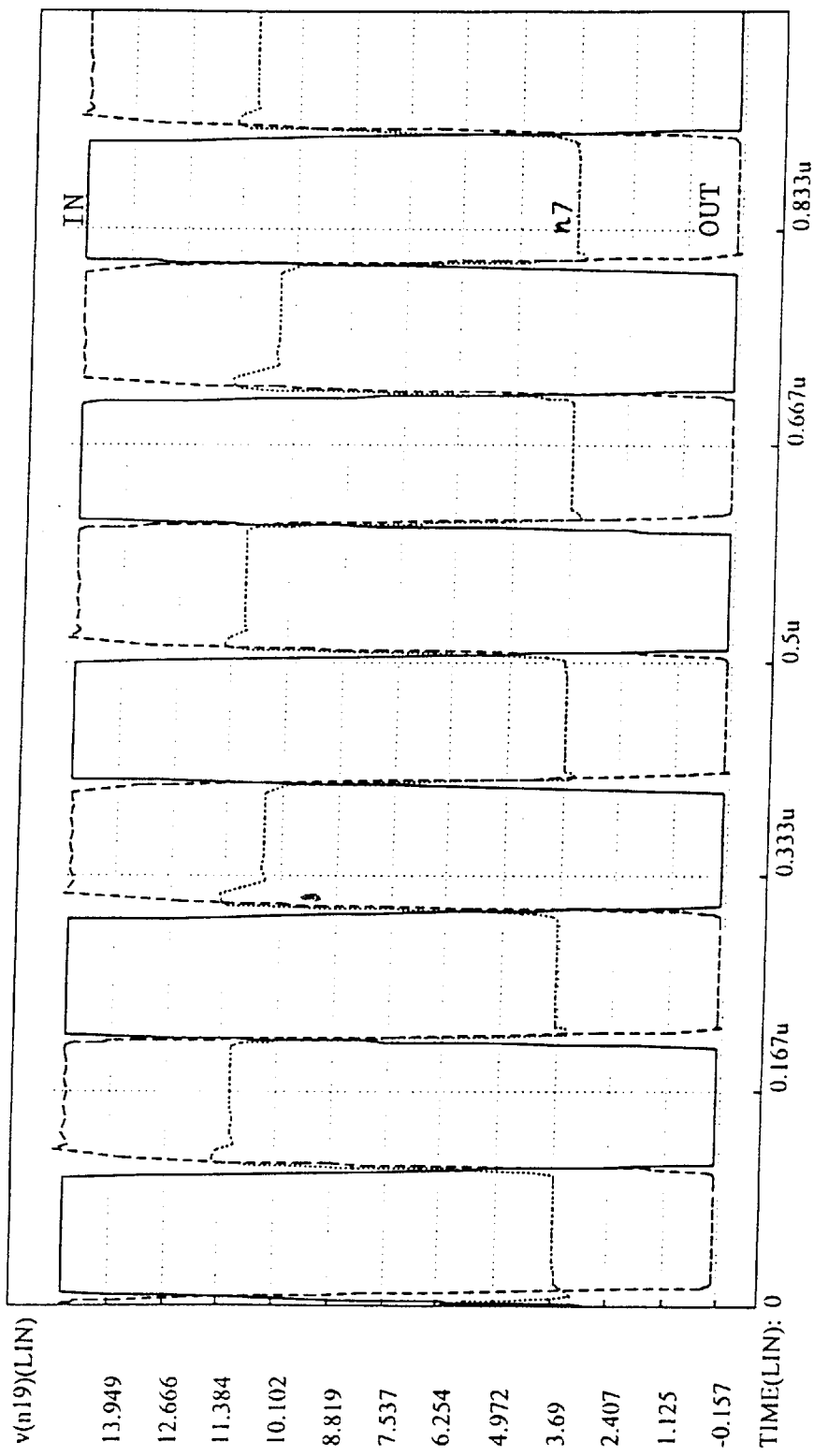
FIG. 4 shows waveforms for explaining the relation of input and output signals.

As shown in FIG. 3, the voltage difference between the drain and source of fourth PMOS transistor MP4 is reduced because voltage A, applied to the source of fifth PMOS transistor MP5, is about 10 V. Similarly, the voltage difference between the drain and source of fourth NMOS transistor MN4 decreases because voltage B, applied to the source of fifth NMOS transistor MN5, is about 5 V. Accordingly, stability can be achieved in the operation of the circuit. Referring to FIG. 4, the output voltage is changed from 0 V to 15 V as the input voltage is varied from 0 V to 15 V.

Figure 5:
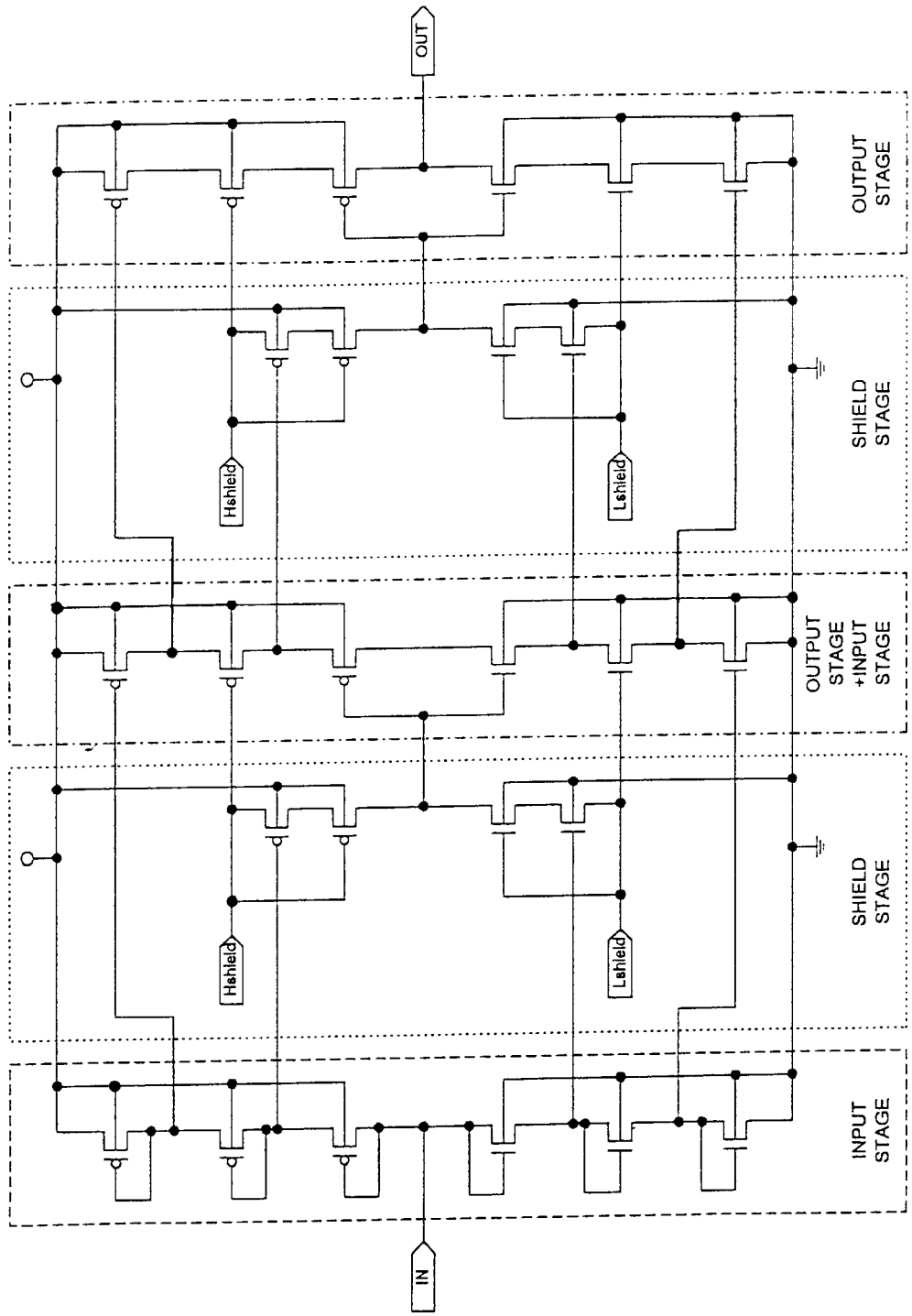
FIG. 5 is a block diagram showing the serial connection of circuit of FIG. 2 for obtaining the relation of inphase input/output signals.

The above-described semiconductor circuit for generating a high output voltage according to the present invention serves as an inverter. Thus, it is possible to create constant power according to the input signal when two circuits, having the aforementioned configuration of the present invention, are connected in series. This is shown in FIG. 5.

The semiconductor circuit for generating a high output voltage of the present invention can be used in a device, for example, a driver, which employs a high-voltage transistor using standard CMOS, as is provides an output that is three times greater than the operation voltage of standard CMOS.

It will be apparent to those skilled in the art that various modifications and variations can be made in the semiconductor circuit for generating a high output voltage of the present invention without departing from the spirit or scope of the invention. Thus, it is intended that the present invention cover the modifications and variations of this invention provided they come within the scope of the appended claims and their equivalents.

What is claimed is:

1. A semiconductor circuit for generating a high output voltage comprising:
   a first voltage dividing circuit connected to a first fixed voltage and a second voltage dividing circuit connected to a second fixed voltage lower than said first fixed voltage,
   each said voltage dividing circuit having a plurality of stages for dividing an input voltage, a total number of said stages being sufficient to ensure that individual voltage drops across said stages, respectively, do not exceed a channel breakdown voltage for a predetermined transistor technology;
   a pull-up circuit, connected to said first voltage dividing circuit, for pulling up an output voltage to a first predetermined level, said pull-up circuit having a plurality of modules sufficient in number to ensure that individual voltage changes across said modules, respectively, do not exceed said channel breakdown voltage;
   a pull-down circuit, connected to said second voltage dividing circuit, for pulling down said output voltage to a second predetermined level, said pull-down circuit having a plurality of modules sufficient in number to ensure that individual voltage drops across said modules, respectively, do not exceed said channel breakdown voltage;
   a first control circuit for enabling or disabling operation of said pull-up circuit based upon at least one voltage from said first voltage dividing circuit; and
   a second control circuit for disabling or enabling said pull-down circuit, respective to said first control circuit, based upon at least one voltage from said second voltage dividing circuit.

2. The circuit of claim 1, wherein the first voltage dividing circuit includes:
   a first PMOS transistor constructed such that a source thereof receives said first fixed voltage, and a gate and a drain thereof are connected to each other, a voltage on the drain of said first PMOS transistor being a first voltage-divided signal;
   a second PMOS transistor constructed so that a source thereof is connected to the drain of the first PMOS transistor, and a gate and a drain of the second PMOS transistor being connected to each other, a voltage supplied on the drain of said second PMOS transistor being a second voltage-divided signal;
   a third PMOS transistor constructed such that a source thereof is connected to the drain of the second PMOS transistor, and a gate and a drain of said third PMOS transistor are connected to each other;
   wherein said second dividing circuit includes:
   a third NMOS transistor constructed so that a drain and a gate thereof are connected in common to a signal input terminal which is also connected to the drain of the third PMOS transistor, a voltage on the source of the third NMOS transistor being a third voltage-divided signal;
   a second NMOS transistor constructed so that a drain and a gate thereof are commonly connected to receive the voltage on the source of the third NMOS transistor, a voltage on the source of the second NMOS transistor being a fourth voltage-divided signal; and
   a first NMOS transistor constructed so that a drain and gate thereof are connected to receive the voltage on the source of the second NMOS transistor.

3. The circuit of claim 2, wherein the first control circuit includes:
   a fourth PMOS transistor constructed so that a source thereof receives a first control voltage having a predetermined level as its driving voltage, and a gate thereof receives the second voltage-divided signal;
   a fifth PMOS transistor constructed so that a gate thereof receives the first control voltage, and a source thereof receives a voltage on a drain of the fourth PMOS transistor;
   wherein said second control circuit includes:
   a fifth NMOS transistor constructed so that a gate thereof receives a second control signal, and a drain thereof is connected to a drain of the fifth PMOS transistor; and
   a fourth NMOS transistor constructed so that a drain thereof is connected to a source of the fifth NMOS transistor, and a gate of the fourth NMOS transistor receives the third voltage-divided signal.

4. The circuit of claim 3, wherein the pull-up circuit includes:
   a sixth PMOS transistor constructed so that a source thereof receives the first fixed voltage and a gate thereof receives the first voltage-divided signal;
   a seventh PMOS transistor constructed so that a gate thereof receives the first control voltage, and a source thereof receives a voltage on a drain of the sixth PMOS transistor;
   an eighth PMOS transistor constructed so that a source thereof receives a voltage on a drain of the seventh PMOS transistor, and a gate of the eighth PMOS transistor receives a voltage on the drain of the fifth PMOS transistor;
   wherein the pull-down circuit includes:
   an eighth NMOS transistor constructed such that a drain thereof is connected to a drain of the eighth PMOS transistor, and a gate of the eighth NMOS transistor is connected to the gate of the eighth PMOS transistor;
   a seventh NMOS transistor constructed so that a drain thereof receives the voltage applied to a source of the eighth NMOS transistor, and a gate of the seventh NMOS transistor receives the second control signal; and
   a sixth NMOS transistor constructed so that a drain thereof receives a voltage on a source of the seventh NMOS transistor, and a gate of said sixth NMOS transistor receives the fourth voltage-divided signal.

5. The circuit of claim 2, wherein a substrate voltage of the PMOS transistors is the first fixed voltage.

6. The circuit of claim 3, wherein a substrate voltage of the PMOS transistors is the first fixed voltage.

7. The circuit of claim 4, wherein a substrate voltage of the PMOS transistors is the first fixed voltage.

8. The circuit of claim 2, wherein a substrate voltage of the NMOS transistors is the second fixed voltage.

9. The circuit of claim 3, wherein a substrate voltage of the NMOS transistors is the second fixed voltage.

10. The circuit of claim 4, wherein a substrate voltage of the NMOS transistors is the second fixed voltage.

11. The circuit of claim 1, wherein the first control voltage is 66% of the first fixed voltage.

12. The circuit of claim 3, wherein the first control voltage is 66% of the first fixed voltage.

13. The circuit of claim 4, wherein the first control voltage is 66% of the first fixed voltage.

14. The circuit of claim 1, wherein the second control voltage is 33% of the first fixed voltage.

15. The circuit of claim 3, wherein the second control voltage is 33% of the second fixed voltage.

16. The circuit of claim 4, wherein the second control voltage is 33% of the second fixed voltage.

17. The circuit of claim 1, wherein the first control voltage is at a level corresponding to an integer multiple of a gate voltage of said predetermined transistor technology, and the second control voltage is at a level corresponding to half of the level of the first control voltage.

18. The circuit of claim 3, wherein the first control voltage is at a level corresponding to an integer multiple of a gate voltage of said predetermined transistor technology, and the second control voltage is at a level corresponding to half of the level of the first control voltage.

19. The circuit of claim 4, wherein the first control voltage is at a level corresponding to an integer multiple of a gate voltage of said predetermined transistor technology, and the second control voltage is at a level corresponding to half of the level of the first control voltage.

20. The circuit of claim 1, wherein said first fixed voltage is VDD.

21. The circuit of claim 1, wherein said second fixed voltage is ground.

22. A semiconductor circuit for generating a high output voltage comprising:

an input circuit to generate a voltage-divided signal for controlling turn-on, which is sequentially turned on only when an input signal is in a first logic state, to step down a driving voltage having a predetermined level in ratios different from each other, thereby generating first and second voltage-divided signals, and which is sequentially turned on only when the input signal is in a second logic state, to step down the input signal in ratios different from each other, thereby generating third and fourth voltage-divided signals;

a shield circuit to limit voltage variation and to receive a first control signal, second control signal, and the second and third voltage-divided signals output from the voltage-divided signal generating circuit, to pull up or pull down data nodes according to the state of each signal, the first control signal being a signal which is voltage-reduced from the driving voltage to a predetermined level, the second control signal being a signal which is voltage-reduced from the driving voltage to a level lower than that of the first control signal, the shield circuit maintaining a fixed variation width between the ground potential and driving voltage; and an output circuit to generate an output signal for pulling up or pulling down the potential applied to an output terminal according to the voltage state of the data nodes, the data nodes being which are maintained within a fixed range by the shield circuit, a pull-up part of said output circuit forming a driving voltage transmitting path according to the first control signal and first voltage-divided signal, a pull-down part of said output circuit forming a ground potential transmitting path according to the second control signal and fourth voltage-divided signal.

23. The circuit of claim 22, wherein the voltage level of the input signal is identical to the ground potential when it is in the first logic state.

24. The circuit of claim 22, wherein the voltage level of the input signal is identical to the driving voltage when it is in the second logic state.

* * * * *